(12) United States Patent
Ventajol

(10) Patent No.: US 6,362,047 B1
(45) Date of Patent: Mar. 26, 2002

(54) METHOD OF MANUFACTURING EEPROM MEMORY POINTS

(75) Inventor: Philippe Ventajol, Aix en Provence (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/690,529

(22) Filed: Oct. 17, 2000

(30) Foreign Application Priority Data

Oct. 21, 1999 (FR) .............................................. 99 13378

(51) Int. Cl.[7] .............................................. H01L 21/336
(52) U.S. Cl. ....................................... 438/257; 438/264
(58) Field of Search ................................. 438/257, 259, 438/260, 264, 589, 762, 763, 199, 238, 253, 258

(56) References Cited

U.S. PATENT DOCUMENTS

| | | | | |
|---|---|---|---|---|
| 5,047,362 A | * | 9/1991 | Bergenmont ................ 438/257 |
| 5,256,584 A | * | 10/1993 | Hartmann .................... 438/257 |
| 5,336,628 A | * | 8/1994 | Hartmann .................... 438/257 |
| 5,511,036 A | | 4/1996 | Farb et al. ................ 365/185.1 |
| 5,596,529 A | | 1/1997 | Noda et al. ............ 365/185.28 |
| 5,702,966 A | | 12/1997 | Noda et al. ................... 437/43 |
| 5,702,988 A | * | 12/1997 | Liang .......................... 438/238 |
| 5,844,268 A | | 12/1998 | Noda et al. .................. 257/314 |
| 5,895,240 A | * | 4/1999 | Chuang et al. ............. 438/260 |

OTHER PUBLICATIONS

French Preliminary Search Report from French patent application No. 9913378, filed Oct. 21, 1999.

* cited by examiner

*Primary Examiner*—David Nelms
*Assistant Examiner*—Phuc T. Dang
(74) *Attorney, Agent, or Firm*—Wolf, Greenfield & Sacks, P.C.; James H. Morris

(57) ABSTRACT

A method for manufacturing memory points including control and floating gates, including the steps of: delimiting at the surface of the substrate an active region by insulation areas; forming a first insulating layer; opening a window in the first insulating layer to partially expose the entire width of the active region and a portion of the insulating areas; forming a second very thin insulating layer; depositing a first conductive material; forming a third insulating layer; and depositing a second conductive material, and further including a step of etching the first and second conductors and the third, second, and first insulating layers according to a same contour to expose the active region and the insulation areas in the vicinity of the borders between the active region and the insulation areas.

10 Claims, 3 Drawing Sheets

METHOD OF MANUFACTURING EEPROM MEMORY POINTS

BACKGROUND OF THE INVENTION

1. Field of the Invention

The present invention generally relates to the manufacturing of EEPROM memory points including, in a portion of a floating gate, a tunnel-type gate insulator.

2. Discussion of the Related Art

EEPROM memories are formed from memory cells formed, for example, as illustrated in FIG. 1, with a read transistor T1 and a memory point T2. Transistor T1 is a conventional MOS transistor including a drain D1, a source S1, and an insulated gate G1. Memory point T2 is of double-gate type. It includes a drain D2, a source S2, and two insulated gates, that is, a floating gate FG and a control gate CG. The invention more particularly address memory points, the floating gate insulator of which includes at least a sufficiently thin portion to enable carriers to flow by tunnel effect between the underlying channel and the floating gate, said insulator being called a "tunnel insulator" or "tunnel oxide". Source S1 of transistor T1 is interconnected to drain D2 of memory point T2.

FIGS. 2A, 2B, and 2C respectively illustrate a top view and cross-section views along respective axes B—B and C—C of a conventional memory cell.

The cell is formed in an active region of a semiconductor substrate 1, typically made of polysilicon, laterally delimited by field insulation areas 2.

An insulating layer 3 is intended for forming the gate insulator of transistor T1 and the non-tunnel portion of the insulator of floating gate FG of memory point T2. Insulator 3 generally is a silicon oxide layer ($SiO_2$) deposited by vapor-phase chemical deposition.

Layer 3 has been partially removed from the surface of the active region, to form in the areas corresponding to memory point T2 a window W, the contour of which is illustrated, in top view, in dotted lines in FIG. 2A, and the width Ww and the length Wl of which respectively appear in FIGS. 2B and 2C. Window W extends across the entire width of the active region, to field insulation areas 2 and thereabove. An insulating layer 4 has been formed by thermal oxidation of the exposed surface of substrate I at the bottom of window W. Layer 4 forms a tunnel oxide area of the insulator of floating gate FG of memory point T2.

A conductive layer 5 covers insulating layers 3 and 4 and a portion of areas 2. Typically made of polysilicon of a 150-nm thickness, layer 5 is etched to form floating gate FG of memory point T2 and at least a portion of gate G1 of the transistor.

An insulating layer 6 covers layer 5. Typically a silicon oxide—silicon nitride ($Si_3N_4$)—silicon oxide (ONO) multilayer of a thickness between 210 and 230 nm, layer 6 is intended for forming the insulator of control gate CG of memory point T2.

Finally, a conductive layer 7 covers layer 6. Typically made of in-situ doped polysilicon of a thickness between 400 and 500 nm, generally 450 nm, layer 7 is essentially intended for forming control gate CG. To form gate G1, the corresponding portions of layers 5 and 7 are then electrically connected.

A disadvantage of the obtained structure is the fragility of the tunnel oxide at the level of border regions OP1, OP2 between the active region and areas 2 (FIGS. 2A and 2C). Indeed, in these border regions, the growth of tunnel oxide 4 will, in practice, be irregular and will exhibit a smaller thickness. This causes risks of occurrence of leakage currents due to a local "piercing" of the insulator. A short-circuit may even occur between floating gate FG and underlying substrate 1.

Another disadvantage of such a forming method is the irregularity of length W1 of the tunnel oxide. Indeed, if width Ww of the tunnel oxide is defined by the etch mask of layer 3 (opening of window W), its length W1 is defined by the width of the active region between layers 2. In practice, the "bird's beak" ends of areas 2 are irregular. The length, and thus the surface area of insulator 4, are then poorly defined and may vary from one memory cell to another. This surface area can be insufficient or excessive and result in malfunctions of the device.

SUMMARY OF THE INVENTION

An object of the present invention is to provide a novel method for manufacturing a novel memory cell structure that does not exhibit the above-mentioned defects.

To achieve these and other objects, the present invention provides a method for manufacturing a memory point including a control gate and a floating gate above an insulator including a sufficiently thin area to enable a tunnel effect between an underlying semiconductor substrate and the floating gate, including the steps of:

delimiting at the surface of the substrate an active region by field insulation areas;

forming a first insulating layer;

opening a window in the first insulating layer to partially expose the entire width of the active region and a portion of the insulating areas;

forming a second very thin insulating layer by thermal oxidation;

depositing a first conductive material;

forming a third insulating layer; and depositing a second conductive material, and further including the step of etching the second conductive material, the third insulating layer, the first conductive material and the second and first insulating layers according to a same contour to expose the active region and the insulation areas in the vicinity of the border regions between the active region and the insulation areas.

According to an embodiment of the present invention, the step of etching the second conductive material, the third insulating layer, the first conductive material and the second and first insulating layers enables defining the gate structure of a read transistor of an EEPROM-type memory cell including said memory point.

According to an embodiment of the present invention, the window is rectangular.

According to an embodiment of the present invention, the window has dimensions of 0.7* 1.2 µm.

According to an embodiment of the present invention, the first insulating layer is a silicon oxide layer of a thickness ranging between 20 and 30 nm.

According to an embodiment of the present invention, the thermal oxide has a thickness between 5 and 10 nm.

According to an embodiment of the present invention, the first conductive material is a polysilicon layer of a 150-nm thickness.

According to an embodiment of the present invention, the second conductive material is a polysilicon layer of a thickness between 400 and 500 nm.

According to an embodiment of the present invention, after depositing the second conductive material, the surface of the second conductive material is silicided.

According to an embodiment of the present invention, the second conductive material is a polysilicon and tungsten silicide multilayer.

The foregoing as well as other objects, features and advantages of the present invention will be discussed in detail in the following non-limiting description of an embodiment of the present invention in connection with the accompanying drawings.

DETAILED DESCRIPTION

For clarity, the same elements have been referred to by the same references in the different drawings, and further, as usual in the representation of integrated circuits, FIGS. 2A to 3C are not drawn to scale.

Figure 3A:
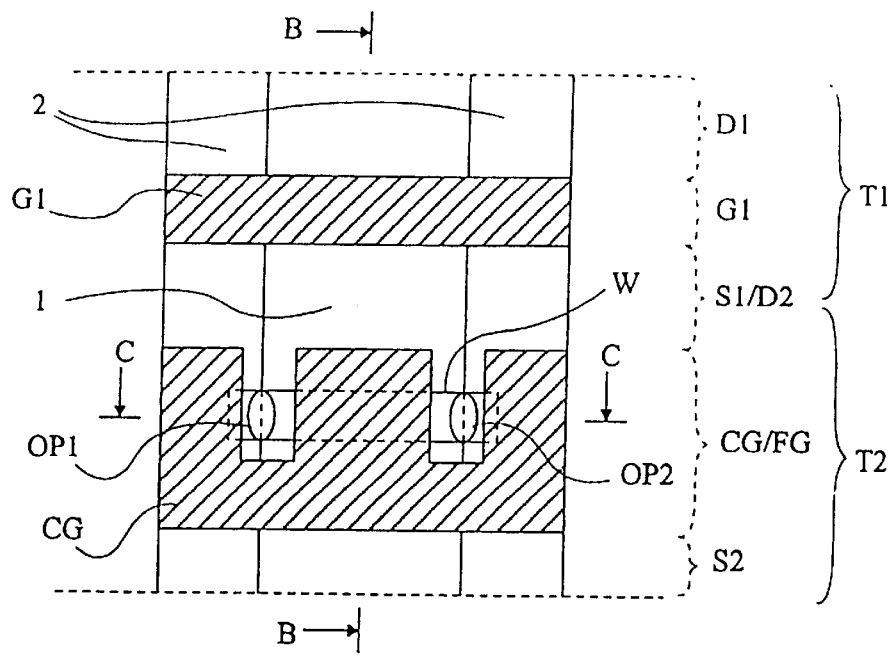
FIGS. 3A, 3B, and 3C illustrate the structure of a cell of the type shown in FIG. 1 formed by means of a method according to the present invention.
Figure 3B:
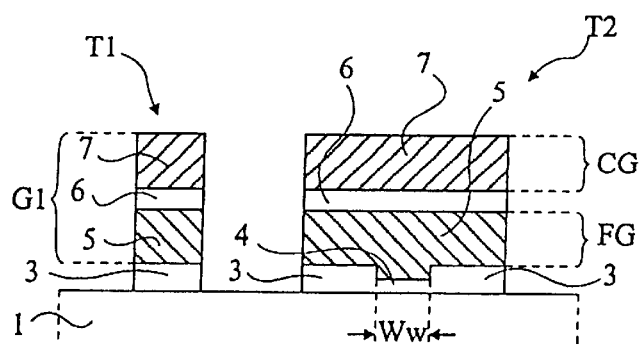
Figure 3C:
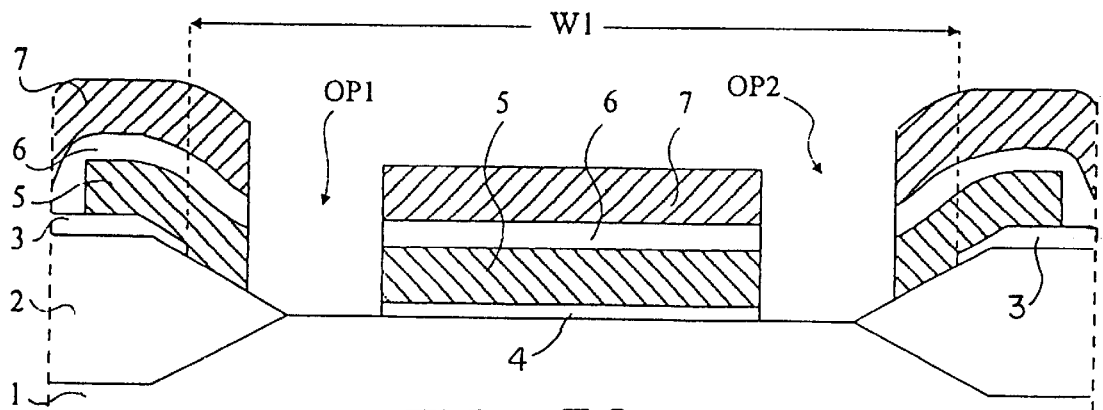

FIGS. 3A, 3B, and 3C illustrate the result of a method according to the present invention. more specifically, FIGS. 3A, 3B, and 3C show a memory cell in respective top and cross-section views along a first axis B—B and a second axis C—C.

Figure 1:
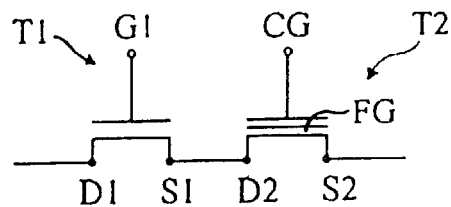
FIG. 1 shows the equivalent diagram of a memory cell of EEPROM type.
Figure 2A:
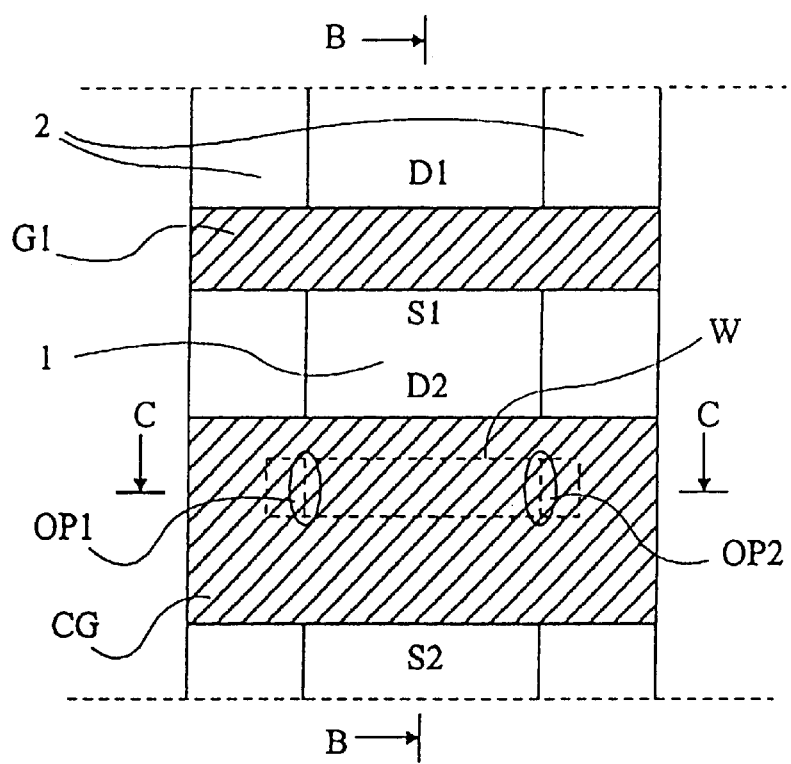
FIGS. 2A, 2B, and 2C illustrate the forming of a cell of the type shown in FIG. 1 according to a conventional method.
Figure 2B:
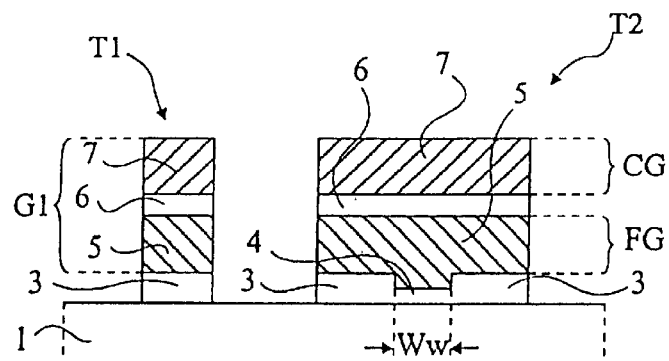
Figure 2C:
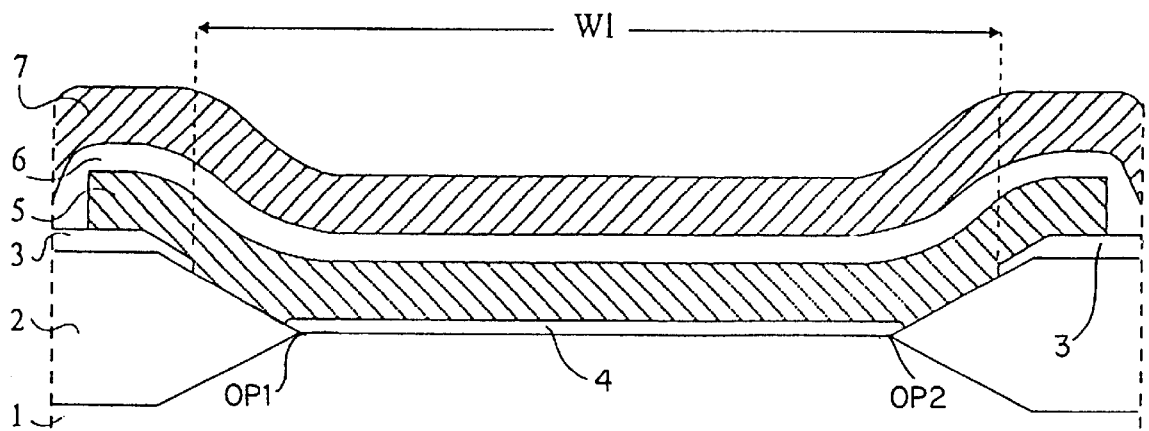

For more clarity, the memory cell illustrated in FIGS. 3A, 3B, and 3C is of the type previously described in relation with FIG. 1. Further, FIGS. 3A, 3B, and 3C illustrate such a cell at a step of its manufacturing similar to that of FIGS. 2A, 2B, and 2C, the respective cross-section axes, B—B, C—C of respective drawings 2B, 3B and 2C, 3C being the same.

The method of the present invention begins with defining an active region at the surface of a substrate 1 by means of field insulation regions 2.

A first gate insulator 3 is then formed. Insulator 3 is similar to a conventional insulator. It is for example a silicon oxide layer obtained by vapor-phase chemical deposition over a thickness ranging between 20 and 30 nm.

In the areas corresponding to memory point T2, insulator 3 is then etched to form a window W. As previously, the dimensions of window W are chosen so that it extends across the entire width of the active regions, and partly above areas 2. Window W is for example rectangular and its width Ww (FIG. 3B) and its length W1 (FIG. 3C) are, for example, approximately 0.7 and 1.2. μm, respectively.

A thermal oxidation is then performed. The oxidation conditions are such that layer 4 thus formed is very thin, of a thickness ranging between 5 and 10 nm. Layer 4 is intended for forming the tunnel oxide of floating gate FG of memory point T2.

A first conductive layer 5, a second gate insulator 6, and a second conductive layer 7 are then respectively deposited. On the side of memory point T2, these layers are intended for respectively forming floating gate FG, an inter-gate insulator, and control gate CG. Preferably, the periphery of first conductive layer 5 is etched before depositing the next layers.

Finally, to obtain the structure illustrated in FIGS. 3A, 3B, and 3C, the gates of elements T1 and T2 are individualized by etching conductive and insulating layers 3, 4, 5, 6, and 7. According to the present invention, this last etch mask is modified. As for a conventional. cell, the gate structures of elements T1 and T2 are individualized and underlying substrate 1 is exposed between said gates, as illustrated in FIGS. 3A and 3B. However, in the area of memory point T2, border regions OP1 and OP2 are excluded from the gate structure, as appears from the comparison of FIGS. 2A and 3A and of FIGS. 2C and 3C. In other words, according to the present invention, the active region and insulation areas 2 are exposed in the vicinity of border regions OP1 and OP2.

It should be noted that it is preferable to modify the sole final individualizing etch mask. The etch mask of first conductive layer 5 could indeed also be modified (before deposition of insulating layer 6). However, in the final gate structure individualizing etching (exposing of substrate 1 between the structures, illustrated in FIGS. 3A and 3B), the substrate would then disadvantageously undergo a significant overetching in the drain/source areas of elements T1 and T2.

The method then carries on conventionally, for example, by the forming of spacers (not shown) on the sides of the gate structures and/or the doping of the different drain and source regions D1, D2 and S1, S2 of the elements T1 and T2.

Layer 7 may be formed either of in-situ doped polysilicon, deposited over a 450-nm thickness, or of a multilayer of 150 nm of in situ doped polysilicon and of 250 nm of tungsten silicide (Wsi2). In the case of a single polysilicon layer, said layer may be silicided before the final etch. Similarly, although the arrangement of the three layers 5, 6 and 7 has been chosen to be kept to form gate G1 of read transistor T1, it would be possible to locally remove, before depositing conductive layer 7, layers 5 and 6, electrode G1 being then formed of the sole layer 7. It would also be possible to etch insulating and conductive layers 6 and 7, electrode G1 being then formed of the sole layer 5, or else to locally remove insulator 6 before depositing layer 7, thus ensuring an electrode G1 formed by the putting in direct contact of layers 5 and 7.

It is also possible to perform previous dopings of the active region, for example, before depositing first insulating layer 3 and/or after opening window W.

An advantage of the present invention is that the length of the tunnel oxide is perfectly defined by the etch mask of the different layers. Its width being defined by the mask of forming of window W, its surface area is thus determined.

Due to the fact that border regions OP1 and OP2 are excluded from the tunnel area, all the disadvantages due to these border regions in conventional structures are advantageously eliminated.

Of course, the present invention is likely to have various alterations, modifications, and improvements which will readily occur to those skilled in the art. In particular, the principles of the present invention have been previously described and illustrated as applied to the simultaneous forming of a read transistor and of a memory point with a control gate and a tunnel oxide floating gate. Those skilled in the art will easily adapt the described materials and mask patterns to a specific manufacturing line and select the thicknesses and doping levels of the various insulating and conductive layers according to the desired performances.

Such alterations, modifications, and improvements are intended to be part of this disclosure, and are intended to be within the spirit and the scope of the present invention.

Accordingly, the foregoing description is by way of example only and is not intended to be limiting. The present invention is limited only as defined in the following claims and the equivalents thereto.

What is claimed is:

1. A method for manufacturing a memory point including a control gate and a floating gate above an insulator including a sufficiently thin area to enable a tunnel effect between an underlying semiconductor substrate and the floating gate, including the steps of:

delimiting at the surface of the substrate an active region by field insulation areas;

forming a first insulating layer;

opening a window in the first insulating layer to partially expose the entire width of the active region and a portion of the insulating areas;

forming a second very thin insulating layer by thermal oxidation;

depositing a first conductive material;

forming a third insulating layer; and depositing a second conductive material, further including the step of etching the second conductive material, the third insulating layer, the first conductive material and the second and first insulating layers according to a same contour to expose the active region and the insulation areas in the vicinity of the border regions between the active region and the insulation areas.

2. The method of claim 1, wherein the step of etching the second conductive material, the third insulating layer, the first conductive material and the second and first insulating layers enables defining the gate structure of a read transistor of an EEPROM-type memory cell including said memory point.

3. The method of claim 1, wherein the window is rectangular.

4. The method of claim 3, wherein the window has dimensions of 0.7*1.2 $\mu$m.

5. The method of claim 1, wherein the first insulating layer is a silicon oxide layer of a thickness ranging between 20 and 30 nm.

6. The method of claim 1, wherein the thermal oxide has a thickness between 5 and 10 nm.

7. The method of claim 1, wherein the first conductive material is a polysilicon layer of a 150-nm thickness.

8. The method of claim 1, wherein the second conductive material is a polysilicon layer of a thickness between 400 and 500 nm.

9. The method of claim 8, including, after deposition of the second conductive material, a step of siliciding the surface of the second conductive material.

10. The method of claim 1, wherein the second conductive material is a polysilicon and tungsten silicide multilayer.

* * * * *